(12) United States Patent
Rezaiifar et al.

(10) Patent No.: US 8,874,793 B2
(45) Date of Patent: Oct. 28, 2014

(54) METHODS AND APPARATUS FOR IMPROVING HEADER COMPRESSION

(75) Inventors: Ramin Rezaiifar, San Diego, CA (US); Robert Howard Kimball, Encinitas, CA (US)

(73) Assignee: Qualcomm Innovation Center, Inc., San Diego, CA (US)

( * ) Notice: Subject to any disclaimer, the term of this patent is extended or adjusted under 35 U.S.C. 154(b) by 403 days.

(21) Appl. No.: 12/886,111

(22) Filed: Sep. 20, 2010

(65) Prior Publication Data

US 2011/0231577 A1 Sep. 22, 2011

Related U.S. Application Data

(60) Provisional application No. 61/264,982, filed on Nov. 30, 2009.

(51) Int. Cl.
| | | |
|---|---|---|
| G06F 15/16 | (2006.01) | |
| H04L 29/06 | (2006.01) | |
| H04L 29/08 | (2006.01) | |
| H04L 5/00 | (2006.01) | |
| H04W 28/06 | (2009.01) | |
| H03M 7/30 | (2006.01) | |

(52) U.S. Cl.
CPC .................. H04L 69/22 (2013.01); H04L 69/04 (2013.01); H04L 29/06 (2013.01); H04L 67/02 (2013.01); H04L 5/0044 (2013.01); G06F 15/16 (2013.01); H04W 28/06 (2013.01); H03M 7/30 (2013.01); Y10S 370/912 (2013.01)
USPC ........... 709/247; 709/216; 709/217; 709/238; 709/245; 370/389; 370/392; 370/477; 370/912

(58) Field of Classification Search
CPC ......... H04L 69/22; H04L 69/04; H04L 29/06; H04L 67/02; H04L 5/0044; H04W 28/06; H03M 7/30; G06F 15/16

USPC .......... 709/216–217, 238, 245, 247; 370/389, 370/392, 477, 912
See application file for complete search history.

(56) References Cited

U.S. PATENT DOCUMENTS 6,345,307 B1 2/2002 Booth
6,751,209 B1 6/2004 Hamiti et al.
(Continued)

FOREIGN PATENT DOCUMENTS

CN 101163095 A 4/2008
EP 1447956 A2 8/2004
(Continued)

OTHER PUBLICATIONS

Floyd R et al., "Mobile Web Access Using Enetwork Web Express", IEEE Personal Communications, IEEE Communications Society, US, vol. 5, No. 5, Oct. 1, 1998, pp. 47-52, XP000786616.
(Continued)

*Primary Examiner* — Hitesh Patel
(74) *Attorney, Agent, or Firm* — Neugeboren O'Dowd PC

(57) ABSTRACT

A method and apparatus for reducing HTTP header is provided. The method may include receiving a suppression identifier list, wherein the suppression identifier list associates header identifier values with at least a portion of one or more header content items in an HTTP header, replacing the one or more header content items with the corresponding header field identifier from the suppression identifier list, and transmitting the data packet with the one or more header field identifiers replacing the corresponding one or more header content items.

14 Claims, 7 Drawing Sheets

(56) References Cited

U.S. PATENT DOCUMENTS

| | | |
|---|---|---|
| 7,020,719 B1 | 3/2006 | Grove et al. |
| 7,418,518 B2 | 8/2008 | Grove et al. |
| 2005/0030944 A1* | 2/2005 | Lazarus et al. ............... 370/389 |
| 2005/0188054 A1* | 8/2005 | Riihijarvi et al. ............. 709/218 |
| 2006/0262788 A1 | 11/2006 | Johnson et al. |
| 2006/0268857 A1* | 11/2006 | Bessis et al. ................. 370/389 |
| 2008/0037543 A1* | 2/2008 | Sala et al. .................... 370/392 |
| 2011/0122893 A1* | 5/2011 | Kang et al. ................... 370/477 |

FOREIGN PATENT DOCUMENTS

| | | |
|---|---|---|
| JP | 2002158739 A | 5/2002 |
| JP | 2003522358 A | 7/2003 |
| JP | 2004511136 A | 4/2004 |
| JP | 2004341884 A | 12/2004 |
| JP | 2007287167 A | 11/2007 |
| JP | 2008526097 A | 7/2008 |
| JP | 2009217836 A | 9/2009 |
| JP | 2010011288 A | 1/2010 |
| WO | 2007065300 A1 | 6/2007 |
| WO | WO2009135995 A1 | 11/2009 |

OTHER PUBLICATIONS

International Search Report and Written Opinion—PCT/US2010/058452, International Search Authority—European Patent Office—Feb. 23, 2011.

Zhigang Liu et al., "HTTP compression techniques", Wireless Communications.

And Networking Conference, 2005 IEEE New Orleans, LA, USA Mar. 13-17, 2005, Piscataway, NJ, USA,IEEE, vol. 4, Mar. 13, 2005, pp. 2495-2500, XP010791568.

Taiwan Search Report—TW099141543—TIPO—Aug. 26, 2013.

Office Action in Japanese Application No. 2012542135, dated Sep. 14, 2013, pp. 5.

* cited by examiner

METHODS AND APPARATUS FOR IMPROVING HEADER COMPRESSION

CROSS-REFERENCE TO RELATED APPLICATION(S)

The present application for patent claims priority to Provisional Application No. 61/264,982, entitled "METHODS AND APPARATUS FOR IMPROVING HEADER COMPRESSION," filed Nov. 30, 2009, the contents of which are expressly incorporated by reference herein.

BACKGROUND

The disclosed aspects relate generally to communications between devices and specifically to methods and systems for facilitating improved header compression.

Advances in technology have resulted in smaller and more powerful personal computing devices. For example, there currently exist a variety of portable personal computing devices, including wireless computing devices, such as portable wireless telephones, personal digital assistants (PDAs) and paging devices that are each small, lightweight, and can be easily carried by users. More specifically, the portable wireless telephones, for example, further include cellular telephones that communicate voice and data packets over wireless networks. Further, many such cellular telephones are being manufactured with relatively large increases in computing capabilities, and as such, are becoming tantamount to small personal computers and hand-held PDAs.

Still further, users of such devices are interested in using the devices to access more web based content. Currently, a device may obtain web content relying on sequential transmission and acknowledgement protocols. As applied to a wired communications network, such protocols have not been found to be overly limiting, as the round trip times have been found to be relatively small. However, unlike in wired communications networks, communications through wireless networks may be unfavorably delayed through sequential transmission and acknowledgement protocols, large packet headers, and the like, thereby increasing the time it takes to access web content.

For example, headers today vary in size from ~200 bytes to over 2 KB. As applications use more cookies and user agents expand features, typical header sizes of 700-800 bytes are common. For wireless modems or asymmetric digital subscriber line (ADSL) connections, in which the uplink bandwidth is fairly low, this latency can be significant. Reducing the data in headers could directly improve the serialization latency to send requests.

Thus, improved apparatus and methods for reducing header sizes are desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with one or more aspects and corresponding disclosure thereof, various aspects are described in relation to reducing HTTP header size. According to one aspect, a method for reducing HTTP header size is provided. The method can comprise receiving a suppression identifier list, wherein the suppression identifier list associates header identifier values with at least a portion of one or more header content items in an HTTP header. Further, the method can comprise replacing the one or more header content items with the corresponding header field identifier from the suppression identifier list. Moreover, the method can comprise transmitting the data packet with the one or more header field identifiers replacing the corresponding one or more header content items.

Another aspect relates to at least one processor configured to reduce HTTP header size. The at least one processor includes a first module for receiving a suppression identifier list, wherein the suppression identifier list associates header identifier values with at least a portion of one or more header content items in an HTTP header. Further, the at least one processor includes a first module for replacing the one or more header content items with the corresponding header field identifier from the suppression identifier list. Moreover, the at least one processor includes a first module for transmitting the data packet with the one or more header field identifiers replacing the corresponding one or more header content items.

Another aspect relates to a computer program product comprising a computer-readable medium. The computer-readable medium comprising code executable to receive a suppression identifier list, wherein the suppression identifier list associates header identifier values with at least a portion of one or more header content items in an HTTP header. Further, the computer-readable medium comprises code executable to replace the one or more header content items with the corresponding header field identifier from the suppression identifier list. Moreover, the computer-readable medium comprises code executable to transmit the data packet with the one or more header field identifiers replacing the corresponding one or more header content items.

Yet another aspect relates to an apparatus. The apparatus can comprise means for receiving a suppression identifier list, wherein the suppression identifier list associates header identifier values with at least a portion of one or more header content items in an HTTP header. Further, the apparatus can comprise means for replacing the one or more header content items with the corresponding header field identifier from the suppression identifier list. Moreover, the apparatus can comprise means for transmitting the data packet with the one or more header field identifiers replacing the corresponding one or more header content items.

Another aspect relates to an apparatus. The apparatus can include a communication module operable to receive a suppression identifier list, wherein the suppression identifier list associates header identifier values with at least a portion of one or more header content items in an HTTP header. Further, the apparatus can include a content module operable to replace the one or more header content items with the corresponding header field identifier from the suppression identifier list. Moreover, the apparatus communication module is further operable to transmit the data packet with the one or more header field identifiers replacing the corresponding one or more header content items.

Additionally, in accordance with one or more aspects and corresponding disclosure thereof, various aspects are described in relations to assisting in HTTP header size reduction. According to one aspect, a method for assisting in HTTP header size reduction is provided. The method can comprise generating a suppression identifier list, wherein the suppression identifier list associates header identifier values with at least a portion of one or more header content items in an HTTP header obtained from one or more user equipments (UEs). Moreover, the method can comprise transmitting the suppression identifier list to at least one of the one or more UEs.

Another aspect relates to at least one processor configured to assist in reducing HTTP header size. The at least one processor includes a first module for generating a suppression identifier list, wherein the suppression identifier list associates header identifier values with at least a portion of one or more header content items in an HTTP header obtained from one or more UEs. Moreover, the at least one processor includes a first module for transmitting the suppression identifier list to at least one of the one or more UEs.

Another aspect relates to a computer program product comprising a computer-readable medium. The computer-readable medium comprising code executable to generate a suppression identifier list, wherein the suppression identifier list associates header identifier values with at least a portion of one or more header content items in an HTTP header obtained from one or more UEs. Moreover, the computer-readable medium comprises code executable to transmit the suppression identifier list to at least one of the one or more UEs.

Yet another aspect relates to an apparatus. The apparatus can comprise means for generating a suppression identifier list, wherein the suppression identifier list associates header identifier values with at least a portion of one or more header content items in an HTTP header obtained from one or more UEs. Moreover, the apparatus can comprise means for transmitting the suppression identifier list to at least one of the one or more UEs.

Another aspect relates to an apparatus. The apparatus can include a content module operable for generating a suppression identifier list, wherein the suppression identifier list associates header identifier values with at least a portion of one or more header content items in an HTTP header obtained from one or more UEs. The apparatus can also include a communication module for transmitting the suppression identifier list to at least one of the one or more UEs.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

Generally, a user may attempt to retrieve content accessible from a content server 130 through a device 110. In one aspect, a device 110 may include: a wireless communications device (WCD), and/or multiple devices, both wireline and wireless. For example, multiple devices may work in tandem, as a network, etc. In such an instance, the device 110 may obtain a requested content item, e.g. a web page, for access by the user. Further, generally, compression may refer to a computationally intensive process in which a data set is reduced in size, while suppression may refer to substitution of smaller size data bits for values in a data set thereby reducing the data set size.

Figure 1:
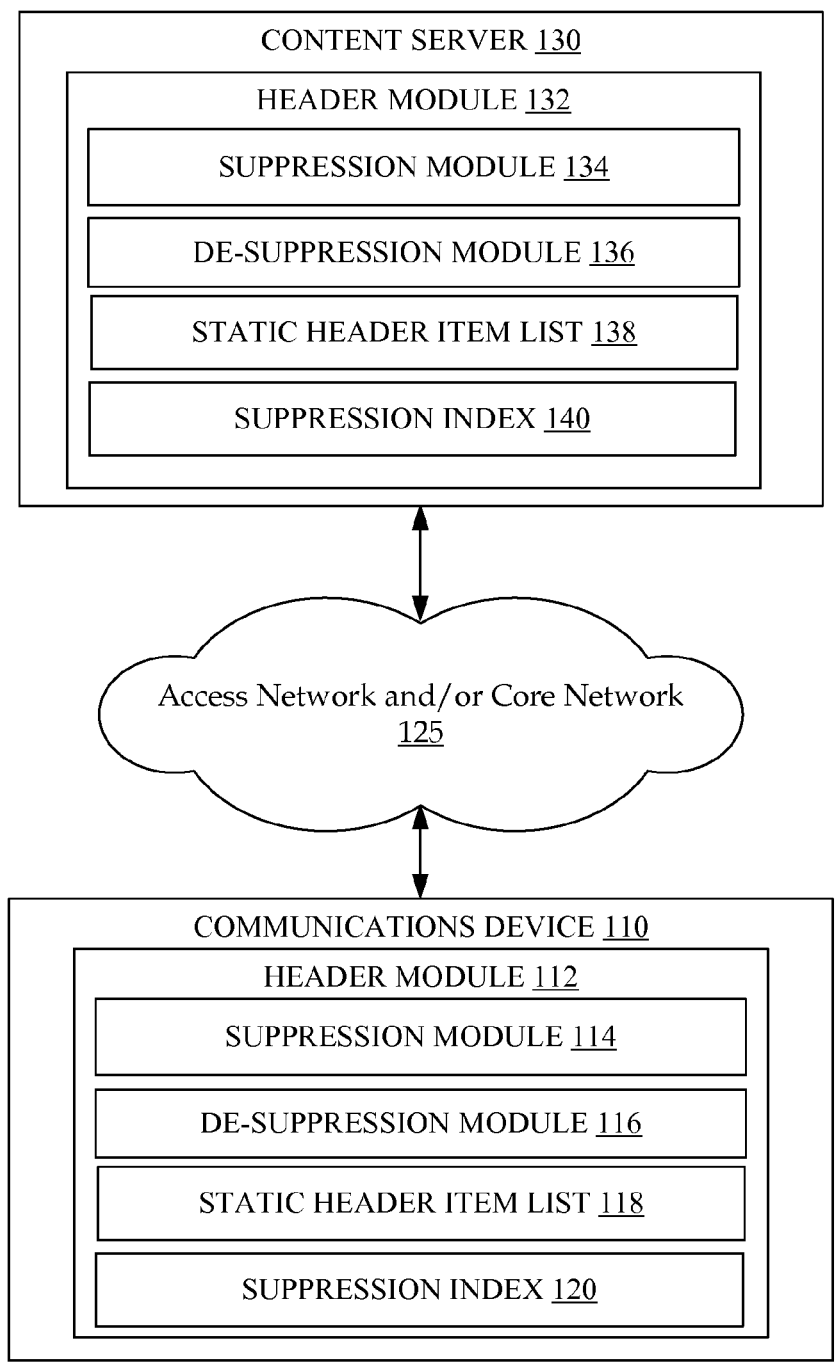
FIG. 1 illustrates a block diagram of a communication network according to an aspect.

With reference to FIG. 1, a block diagram of a communication network 100 according to an aspect is illustrated. Communication network 100 may include communications devices 110 connected to an access network and/or core network 125, e.g., a code division multiple access (CDMA) network, a general packet radio service (GPRS) network, a universal mobile telecommunications system (UMTS) network, and other types of wireline and wireless communication networks. Communication network 100 may further include a one or more of servers, such as content server 130, connected to network 125.

In one aspect, communications device 110 may further include header module 112. In such an aspect, header module 112 may include a suppression module 114, de-suppression module 116, a static header item list 118 and a suppression index 120. Further, header module 112 may assist in header processing for a device 110 intending to transmit and/or receive packets with headers modified according to the described process. In one aspect, suppression module 114 may generate a list of potential header items 118 for suppression. In such an aspect, the list 118 may be transmitted to an intended receiving device, such as content server 130, or another device 110. In one aspect, suppression index 118 may include an ordered list of field identifiers corresponding to header fields which may be suppressed. In such an aspect, de-suppression module 116 may de-suppress header items which have been replaced with index values from the suppression index 120.

In one aspect, content server 130 may further include header module 132. In such an aspect, header module 132 may include a suppression module 134, de-suppression module 136, a static header item list 138 and a suppression index 130. Further, header module 132 may assist in header processing for a server 130 intending to transmit and/or receive packets with headers modified according to the described process. In one aspect, suppression module 134 may generate a list of potential header items 138 for suppression. In such an aspect, the list 138 may be transmitted to an intended receiving device, such as device 110, or another content server 130. In one aspect, suppression index 138 may include an ordered list of field identifiers corresponding to header fields which may be suppressed. In such an aspect, de-suppression module 136 may de-suppression header items which have been replaced with index values from the suppression index 140.

In another aspect, header module 112 may include a full header fielder together with a request to a receiving device, (e.g. content server 130) to generate a new suppression index 140 when header module 112 determines a change in the header. Accordingly, header module 112 may prompt the device to transmit a new static header item list 118 and along with a full header to a receiving device.

In operation, header module 112, 132 associated with a requesting device, such as communications device 110, content server 130, etc., may generate a list of potential header items for suppression 118, 138. In such an aspect, such items may be selected as those items which have remained static for a predefined time. In another aspect, such items may be selected from items known to remain static during transmissions. Further, header module 112, 132 may transmit the list of potential header items for suppression 118 to an intended device, such as content server 130 and/or another device 110. Thereafter, the receiving device may process the list of potential header items for suppression 118, 138 to generate a suppression index for each of the header fields that is to be suppressed 120, 140. In one aspect, such processing may allow both the transmitting and receiving devices to agree on which header items to suppress and the associated index for such header items. In another aspect, such processing may allow the requested device to select not to suppress certain header items. In such an aspect, a generated suppression index may include a blank, zero, etc., to indicate the device has not agreed to suppress specific requested header item. Thereafter, the requested device may transmit the suppression index 120, 140 back to the requesting device. In one aspect, the requesting device may substitute the agreed upon header items with the agreed upon suppression index values.

As such, devices may communicate more efficiently through reduced size header with suppression index value replacing agreed upon static values in such header. This replacing process may take less computing power and may result in small header sizes than conventional compression schemes.

Figure 2A:
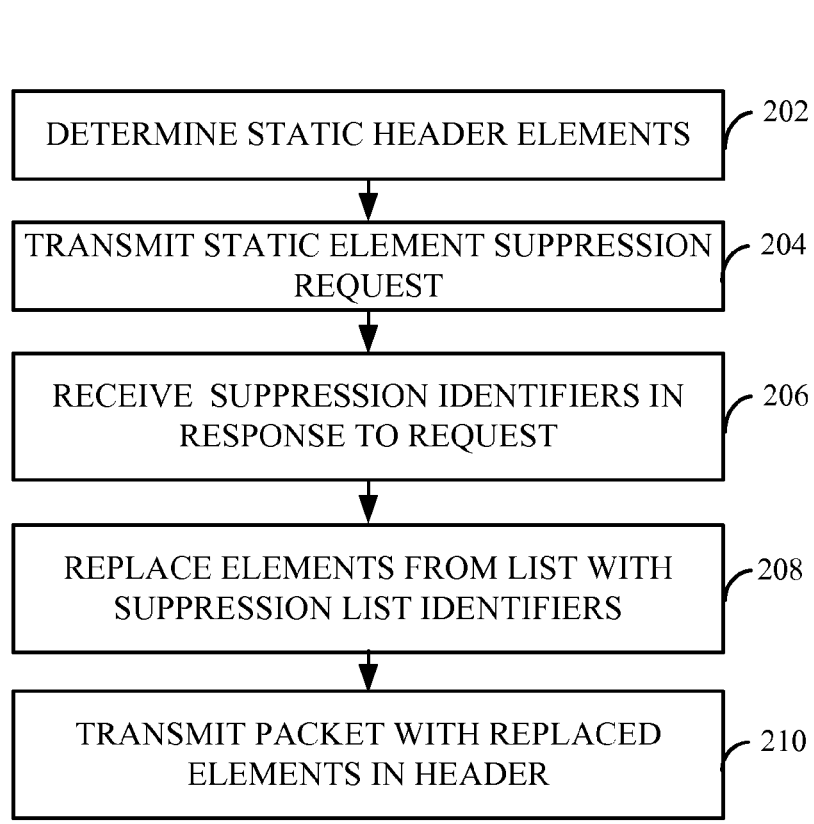
FIG. 2A illustrates a flowchart describing an exemplary system for facilitating header size reduction according to an aspect.
Figure 2B:
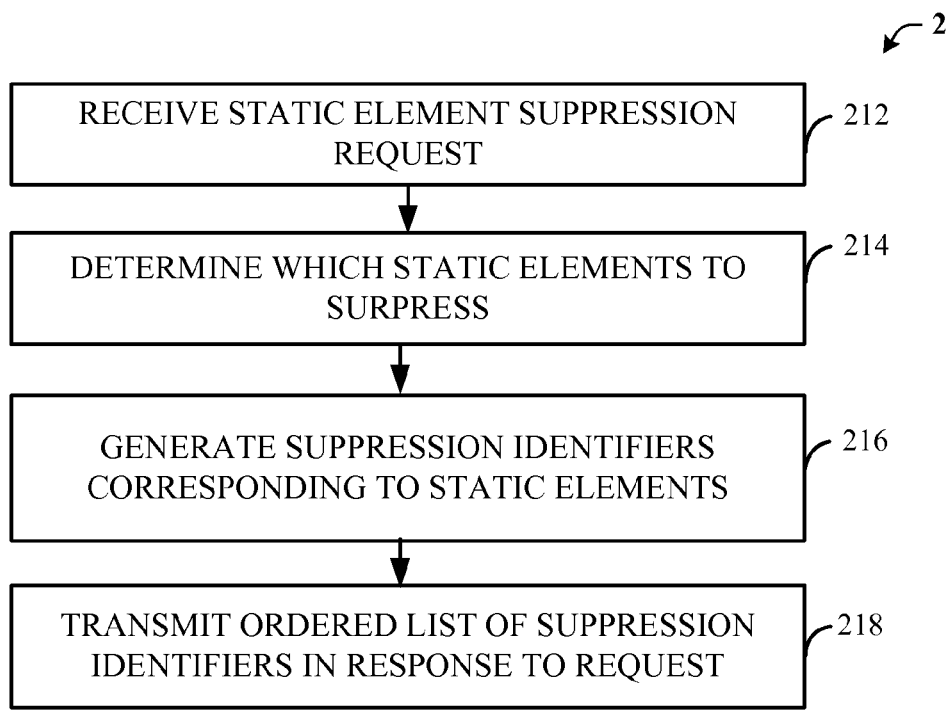
FIG. 2B illustrates another flowchart describing an exemplary system for facilitating header size reduction according to an aspect.

FIGS. 2A and 2B illustrate various methodologies in accordance with various aspects of the presented subject matter. While, for purposes of simplicity of explanation, the methodologies are shown and described as a series of acts or sequence steps, it is to be understood and appreciated that the claimed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

With reference now to FIG. 2A, an exemplary flowchart describing a system 200 for facilitating header size reduction is illustrated. At reference numeral 202, static header items may be determined. In one aspect, such items may be determined as those items which have remained static for a predefined time. In another aspect, such items may be determined from items known to remain static during transmissions. At reference numeral 204, a list of the determined static header items may be transmitted as part of a header suppression request. At reference numeral 206, suppression identifiers may be received in response to the request. In one aspect, the suppression identifiers may include an ordered list of field identifiers corresponding to header fields which may be suppressed. In another aspect, the suppression identifiers may include response values to header items suggested through markers in a header. At reference numeral 208, the identified header items may be replaced by the corresponding field identifiers, thereby reducing the header size. At reference numeral 210, a data packet with the reduced size header may be transmitted.

With reference now to FIG. 2B, another exemplary flowchart describing a system 201 for facilitating header size reduction is illustrated. At reference numeral 212, an element suppression request may be received. At reference numeral 214, a determination is made which items in the received list may be suppressed. In one aspect, a device may select to not suppress certain fields. At reference numeral 216, suppression identifiers corresponding to the received static element list may be generated. In one aspect, the suppression identifiers may include an ordered list of field identifiers corresponding to header fields which may be suppressed. In another aspect, the suppression identifiers may include response values to header items suggested through markers in a header. In one aspect, the generated suppression index may include a blank, zero, etc., to indicate the device has determined not to suppress specific requested header item. At reference numeral 218, the generated suppression index may be transmitted to the requesting device.

Figure 3:
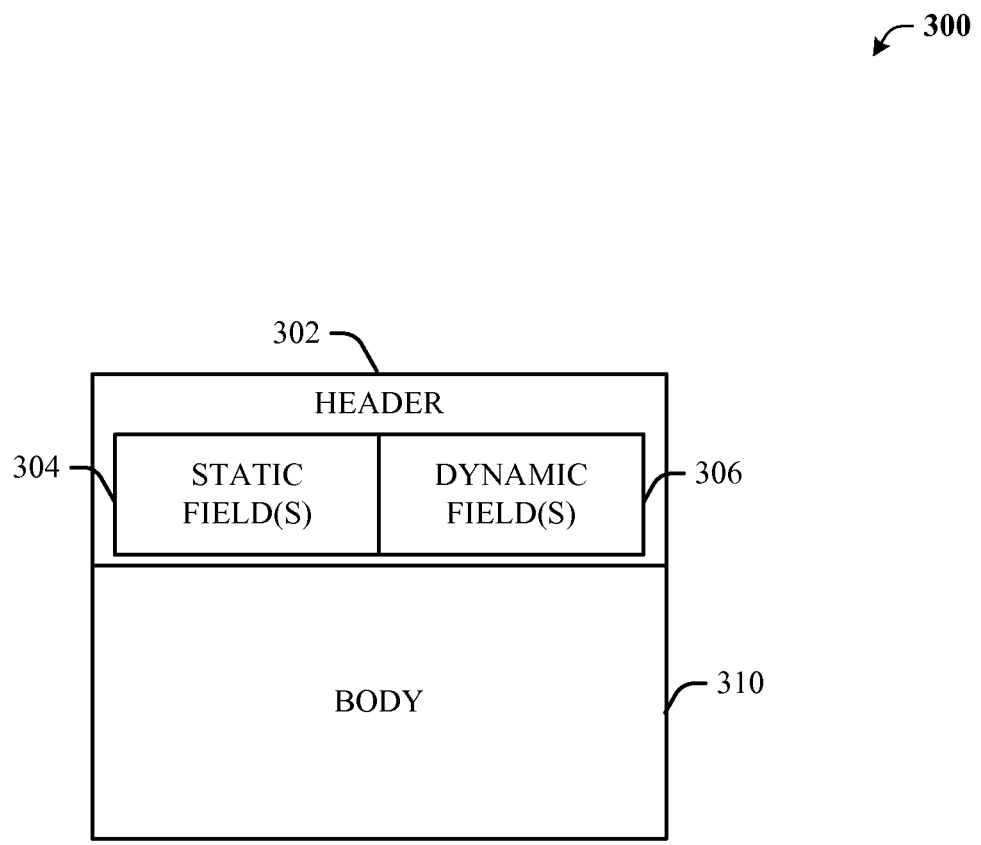
FIG. 3 illustrates a block diagram example architecture of a data packet according to an aspect.

Referring to FIG. 3, a block diagram example architecture of a data packet is depicted. The exemplary data packet includes a header 302 and a body 310. In one aspect, header 302 may include multiple fields, wherein certain fields may remain constant (e.g. static fields 304) while other fields may include values which change during a communication session (e.g. dynamic fields 306). In one aspect, static fields may also include fields in which the value changes in a predefined manner, such as a counter, etc. Static fields 304 may include, for example; a request method field, a request version field, a user-agent field, an accept field, an accept-language field, an accept-encoding field, an accept-character set (charset) field, a cookie field, etc.

Figure 4:
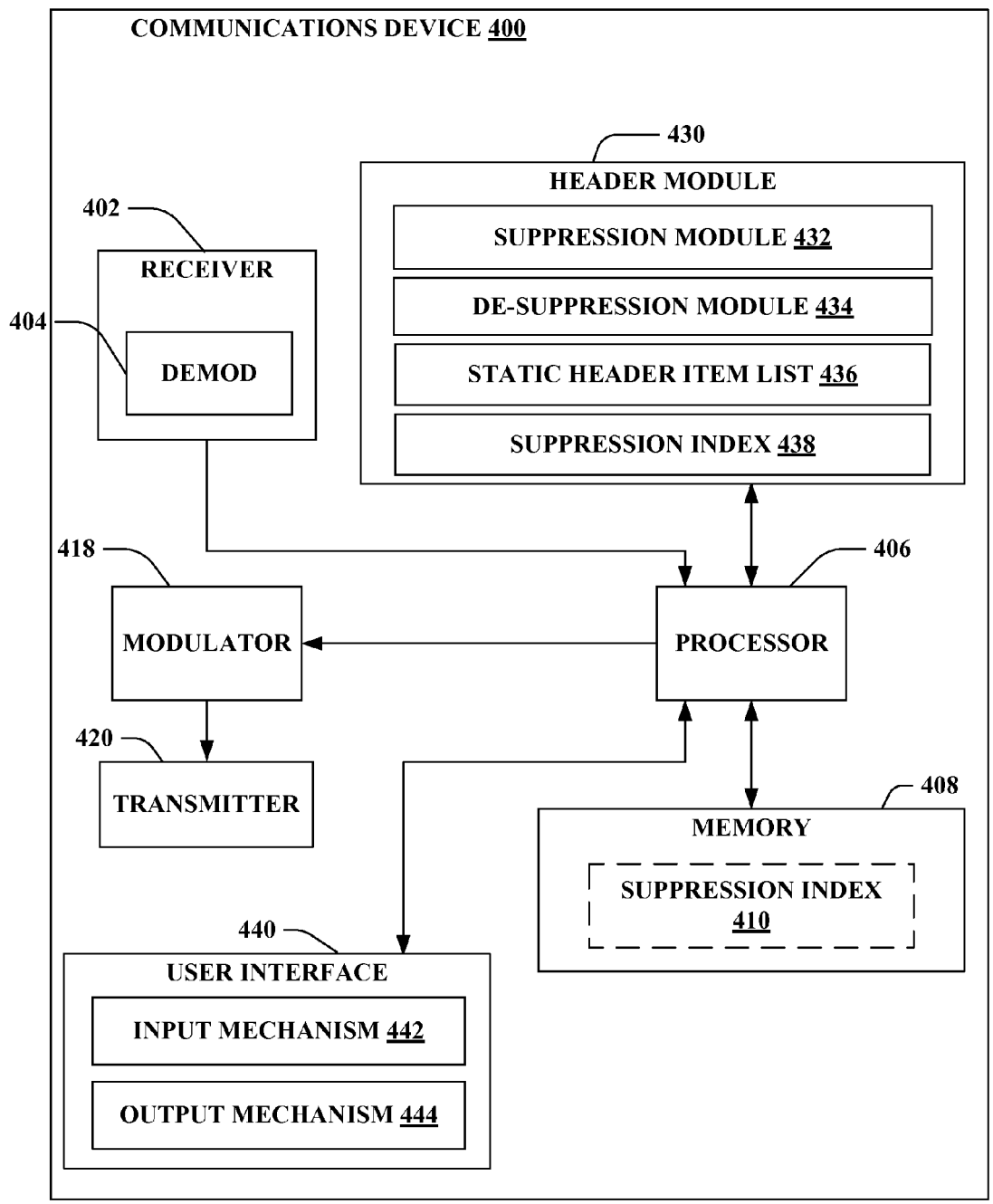
FIG. 4 illustrates a block diagram example architecture of a communications device.

While still referencing FIG. 1, but turning also now to FIG. 4, an example architecture of communications device 110 is illustrated. As depicted in FIG. 4, device 400 comprises receiver 402 that receives a signal from, for instance, a receive antenna (not shown), performs typical actions on (e.g., filters, amplifies, downconverts, etc.) the received signal, and digitizes the conditioned signal to obtain samples. Receiver 402 can comprise a demodulator 404 that can demodulate received symbols and provide them to processor 406 for channel estimation. Processor 406 can be a processor dedicated to analyzing information received by receiver 402 and/or generating information for transmission by transmitter 420, a processor that controls one or more components of device 400, and/or a processor that both analyzes information received by receiver 402, generates information for transmission by transmitter 420, and controls one or more components of device 400.

Device 400 can additionally comprise memory 408 that is operatively coupled to processor 406 and that can store data to be transmitted, received data, information related to available channels, data associated with analyzed signal and/or interference strength, information related to an assigned channel, power, rate, or the like, and any other suitable information for estimating a channel and communicating via the channel. In one aspect, memory 408 can include suppression index 410, obtained by device 400 during interactions with one or more devices. In one aspect, suppression index 410 may include ordered identifiers associated with a list of header items to be replaced. Memory 408 can additionally store protocols and/or algorithms associated with estimating and/or utilizing a channel (e.g., performance based, capacity based, etc.).

Further, processor 406 can provide means for receiving a suppression identifier list, wherein the suppression identifier list associates header identifier values with at least a portion of one or more header content items in an HTTP header, means for replacing the one or more header content items with the corresponding header field identifier from the suppression identifier list, and means for transmitting the data packet with the one or more header field identifiers replacing the corresponding one or more header content items. In another aspect, processor 406 may include at least one processor with one or more modules operable for receiving a suppression identifier list, wherein the suppression identifier list associates header identifier values with at least a portion of one or more header content items in an HTTP header, for replacing the one or more header content items with the corresponding header field identifier from the suppression identifier list, and for transmitting the data packet with the one or more header field identifiers replacing the corresponding one or more header content items.

It will be appreciated that data store (e.g., memory 408) described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable PROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory 408 of the subject systems and methods may comprise, without being limited to, these and any other suitable types of memory.

Device 400 can further include header module 430 to facilitate header size reduction for data packets processed by device 400. In one aspect, header module 430 may include a suppression module 432, de-suppression module 434, a static header item list 436 and a suppression index 438. Further, header module 430 may assist in header processing for device 400 intending to transmit and/or receive packets with headers modified according a process, such as described with reference to FIGS. 2A and 2B. In one aspect, suppression module 432 may generate a list of potential header items 436 for suppression. In such an aspect, the list 436 may be transmitted to an intended receiving device, such as device 110, or a content server 130. In one aspect, suppression index 438 may include an ordered list of field identifiers corresponding to header fields which may be suppressed. In such an aspect, de-suppression module 438 may de-suppression header items which have been replaced with index values from the suppression index 438. In one aspect, header module may suppress header items used in a Hypertext Transfer Protocol (HTTP).

Additionally, mobile device 400 may include user interface 440. User interface 440 may include input mechanisms 442 for generating inputs into communications device 400, and output mechanism 442 for generating information for consumption by the user of the communications device 400. For example, input mechanism 442 may include a mechanism such as a key or keyboard, a mouse, a touch-screen display, a microphone, etc. Further, for example, output mechanism 444 may include a display, an audio speaker, a haptic feedback mechanism, a Personal Area Network (PAN) transceiver etc. In the illustrated aspects, the output mechanism 444 may include a display operable to present media content that is in image or video format or an audio speaker to present media content that is in an audio format.

Figure 5:
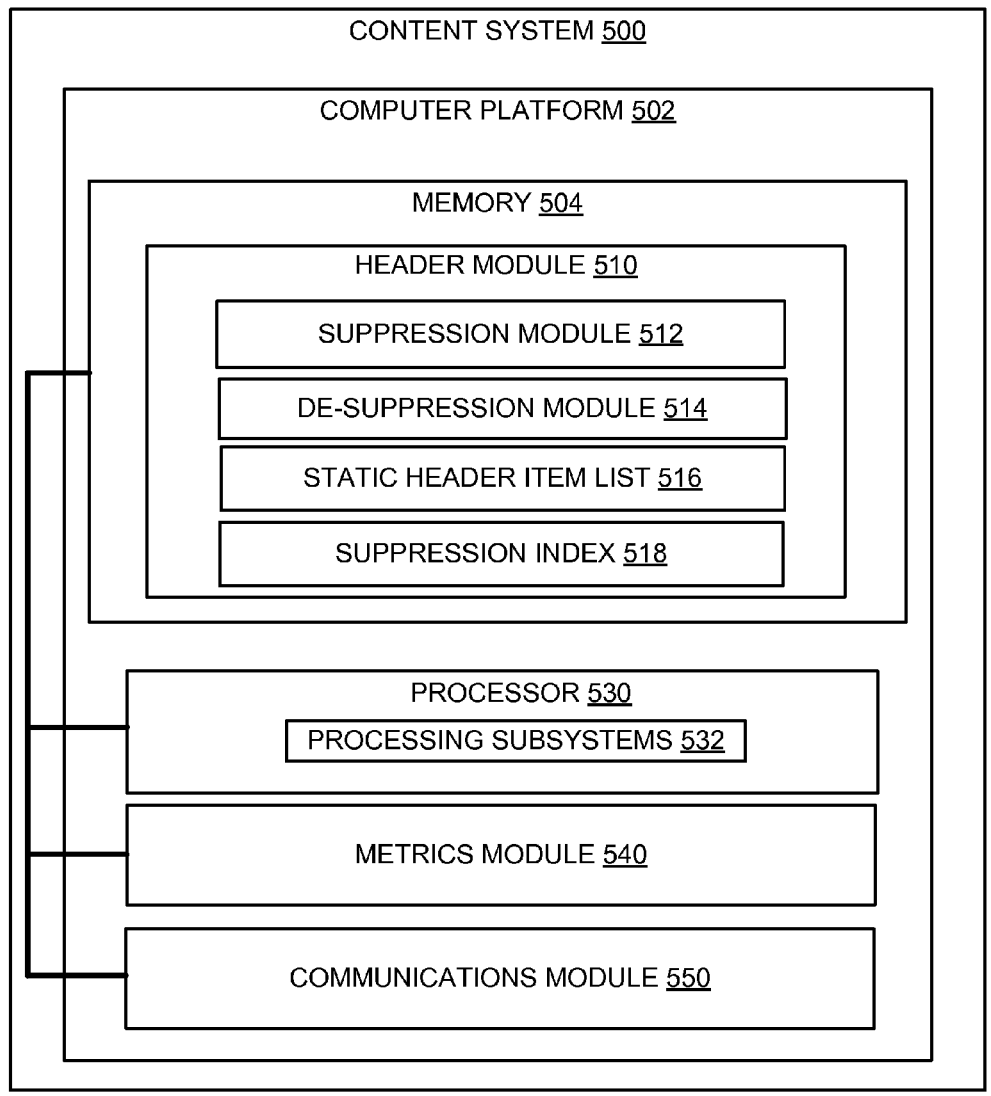
FIG. 5 illustrates exemplary block diagram of a content system according to an aspect.

With reference to FIG. 5, illustrated is a detailed block diagram of content system 500, such as content server 130 depicted in FIG. 1. Content system 500 may comprise at least one of any type of hardware, server, personal computer, mini computer, mainframe computer, or any computing device either special purpose or general computing device. Further, the modules and applications described herein as being operated on or executed by content system 500 may be executed entirely on a single network device, as shown in FIG. 5, or alternatively, in other aspects, separate servers, databases or computer devices may work in concert to provide data in usable formats to parties, and/or to provide a separate layer of control in the data flow between devices, such as communications device 110, and the modules and applications executed by content system 500.

Content system 500 includes computer platform 502 that can transmit and receive data across wired and wireless networks, and that can execute routines and applications. Computer platform 502 includes memory 504, which may comprise volatile and nonvolatile memory such as read-only and/or random-access memory (ROM and RAM), EPROM, EEPROM, flash cards, or any memory common to computer platforms. Further, memory 504 may include one or more flash memory cells, or may be any secondary or tertiary storage device, such as magnetic media, optical media, tape, or soft or hard disk. Further, computer platform 502 also includes processor 530, which may be an application-specific integrated circuit ("ASIC"), or other chipset, logic circuit, or other data processing device. Processor 530 may include various processing subsystems 532 embodied in hardware, firmware, software, and combinations thereof, that enable the functionality of media content distribution system 14 and the operability of the network device on a wired or wireless network.

Further, processor 530 can provide means for generating a suppression identifier list, wherein the suppression identifier list associates header identifier values with at least a portion of one or more header content items in an HTTP header obtained from one or more UEs, and means for transmitting the suppression identifier list to at least one of the one or more UEs. In another aspect, processor 530 may include at least one processor with one or more modules operable for generating a suppression identifier list, wherein the suppression identifier list associates header identifier values with at least a portion of one or more header content items in an HTTP header obtained from one or more UEs, and for transmitting the suppression identifier list to at least one of the one or more UEs Computer platform 502 further includes communications module 550 embodied in hardware, firmware, software, and combinations thereof, that enables communications among the various components of extension system 500, as well as between extension system 500, devices 110, and servers 130, 140. Communication module 550 may include the requisite hardware, firmware, software and/or combinations thereof for establishing a wireless communication connection. According to described aspects, communication module 550 may include the necessary hardware, firmware and/or software to facilitate wireless and/or wireline communication between Content server 130 and device 110.

Computer platform 502 further includes metrics module 540 embodied in hardware, firmware, software, and combinations thereof, that enables metrics received from device 110 corresponding to, among other things, data communicated between device 110 and content server 130. In one aspect, content system 500 may analyze data received through metrics module 540 to modify suppression index stored in memory 504. For example, if the metrics module 540 returns data indicating items included in suppression index 518 are changing regularly, then such items may not be included in future generated suppression indexes 518.

Memory 504 of content system 500 includes a header module 510 operable to facilitate communications using suppression index values as replacements for header items to reduce header size. In one aspect, header module 510 may include a suppression module 512, de-suppression module 514, a static header item list 516 and a suppression index 518. Further, header module 510 may assist in header processing for content system 500 intending to transmit and/or receive packets with headers modified according a process, such as described with reference to FIGS. 2A and 2B. In one aspect, suppression module 512 may generate a list of potential header items 516 for suppression. In such an aspect, the list 516 may be transmitted to an intended receiving device, such as device 110, or a content server 130. In one aspect, suppression index 438 may include an ordered list of field identifiers corresponding to header fields which may be suppressed. In such an aspect, de-suppression module 518 may de-suppression header items which have been replaced with index values from the suppression index 518. In one aspect, header module may suppress header items used in a Hypertext Transfer Protocol (HTTP).

Figure 6:
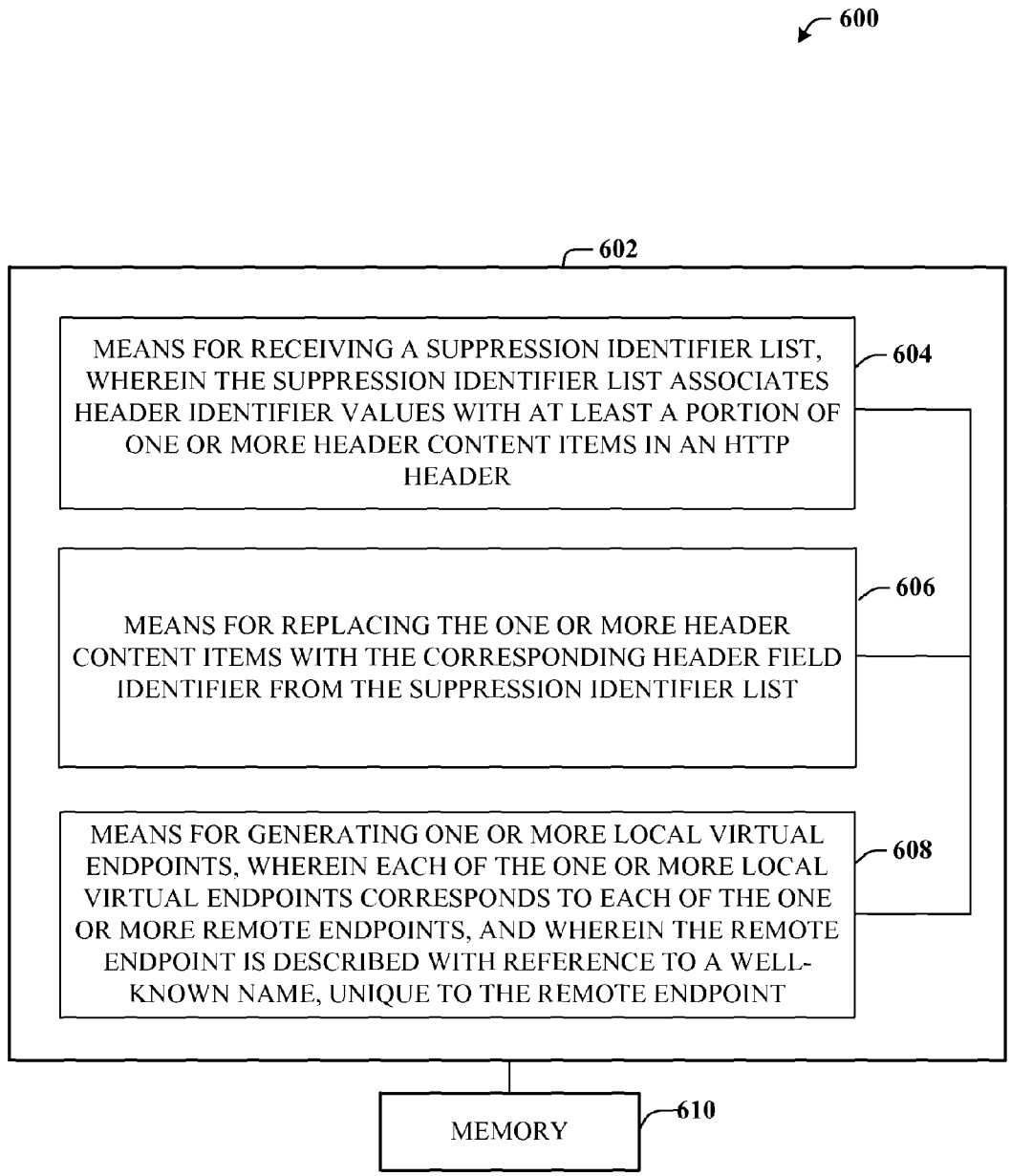
FIG. 6 illustrates a block diagram of an exemplary communication system that can reduce HTTP header size, according to another aspect.

With reference to FIG. 6, illustrated is a system 600 for reducing HTTP header size, according to one aspect. For example, system 600 can reside at least partially within a WCD, UE, etc. According to another exemplary aspect, system 600 can reside at least partially within an access terminal. It is to be appreciated that system 600 is represented as including functional blocks, which can be functional blocks that represent functions implemented by a processor, software, or combination thereof (e.g., firmware).

System 600 includes a logical grouping 602 of means that can act in conjunction. For instance, logical grouping 602 can include means for receiving a suppression identifier list, wherein the suppression identifier list associates header identifier values with at least a portion of one or more header content items in an HTTP header 604. In one aspect, the suppression list includes reference to one or more header content items associated with the HTTP header of a data packet. In another aspect, at least the HTTP header with one or more markings included in the HTTP header indicating items to be suppressed may be transmitted. In still another aspect, wherein the one or more header content items are one or more static header items. In one aspect, receiving the suppression identifier list may include receiving a list with ordered header field identifiers corresponding to the suppression list. Further, logical grouping 602 can include means for replacing the one or more header content items with the corresponding header field identifier from the suppression identifier list 606. In another aspect, the header content item may include, an HTTP cookie reference, a URL reference, a line of HTTP header information, etc. Further, logical grouping 602 can comprise means for transmitting the data packet with the one or more header field identifiers replacing the corresponding one or more header content items 608.

Additionally, system 600 can include a memory 610 that retains instructions for executing functions associated with the means 604, 606 and 608. While shown as being external to memory 610, it is to be understood that one or more of the means 604, 606 and 608 can exist within memory 610.

Figure 7:
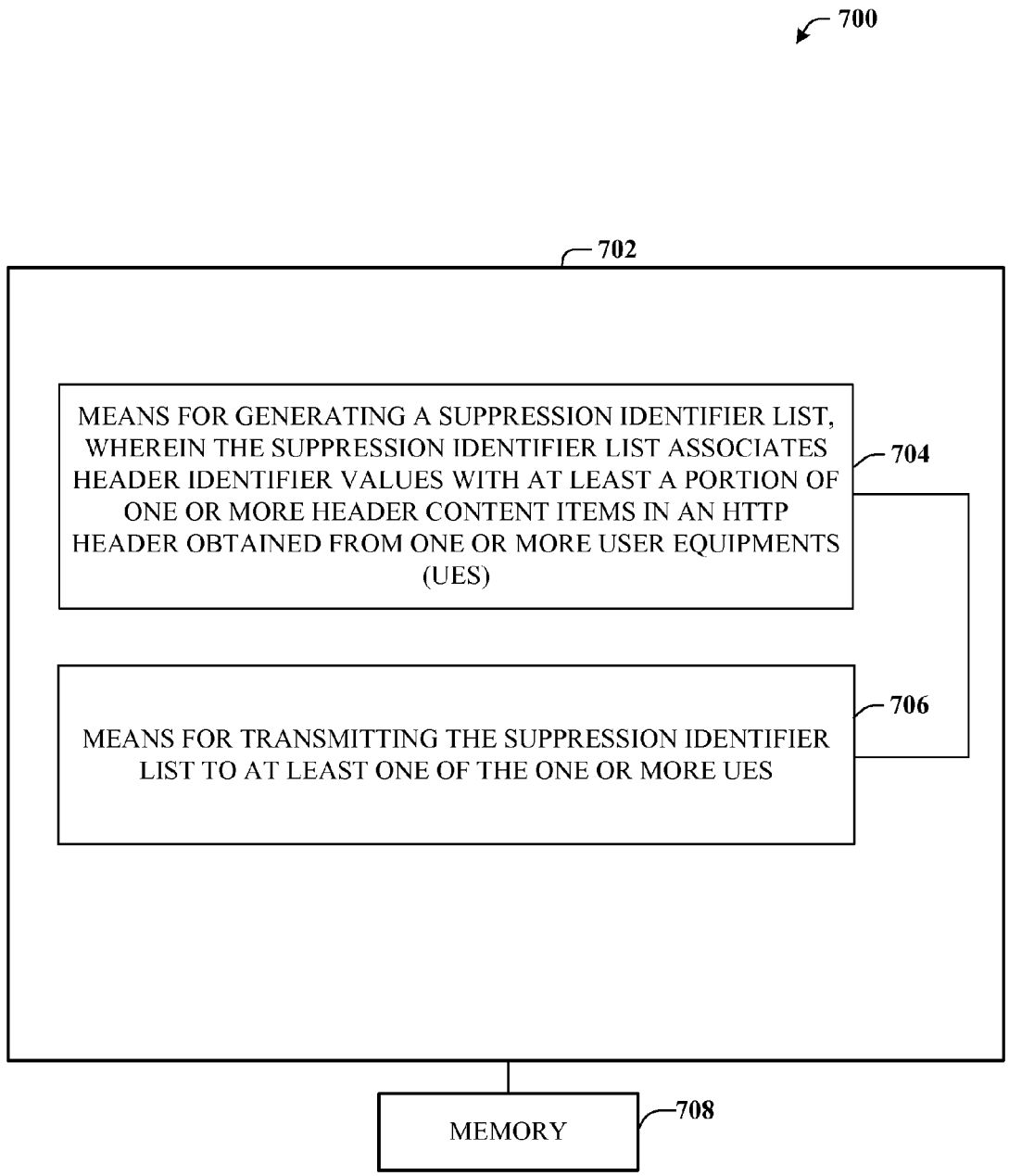
FIG. 7 illustrates a block diagram of an exemplary communication system that can assist in reducing HTTP header size, according to yet another aspect.

With reference to FIG. 7, illustrated is a system 700 for assisting in HTTP header size reduction, according to one aspect. For example, system 700 can reside at least partially within a NodeB, base station, RNC, etc. According to another exemplary aspect, system 700 can reside at least partially within an access network. It is to be appreciated that system 700 is represented as including functional blocks, which can be functional blocks that represent functions implemented by a processor, software, or combination thereof (e.g., firmware).

System 700 includes a logical grouping 702 of means that can act in conjunction. For instance, logical grouping 702 can include means for generating a suppression identifier list, wherein the suppression identifier list associates header identifier values with at least a portion of one or more header content items in an HTTP header obtained from one or more UEs 704. In one aspect, the suppression list may include reference to one or more header content items associated with the HTTP header of a data packet. In another aspect, the suppression list may include at least the HTTP header with one or more markings included in the HTTP header indicating items to be suppressed. In one aspect, the suppression identifier list may include a list with ordered header field identifiers corresponding to the suppression list. Further, logical grouping 702 can include means for transmitting the suppression identifier list to at least one of the one or more UEs 706. In another aspect, the header content item may include, an HTTP cookie reference, a URL reference, a line of HTTP header information, etc.

Additionally, system 700 can include a memory 708 that retains instructions for executing functions associated with the means 704 and 706. While shown as being external to memory 708, it is to be understood that one or more of the means 704 and 706 can exist within memory 708.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various aspects are described herein in connection with a terminal, which can be a wired terminal or a wireless terminal. A terminal can also be called a system, device, subscriber unit, subscriber station, mobile station, mobile, mobile device, remote station, remote terminal, access terminal, user terminal, terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and other variants of CDMA. Further, cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 602.11 (Wi-Fi), IEEE 602.16 (WiMAX), IEEE 602.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Additionally, cdma2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 602.xx wireless LAN, BLUETOOTH and any other short- or long-range, wireless communication techniques.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

The various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

While the foregoing disclosure discusses illustrative aspects and/or aspects, it should be noted that various changes and modifications could be made herein without departing from the scope of the described aspects and/or aspects as defined by the appended claims. Furthermore, although elements of the described aspects and/or aspects may be described or claimed in the singular, the plural is contemplated unless limitation to the singular is explicitly stated. Additionally, all or a portion of any aspect and/or aspect may be utilized with all or a portion of any other aspect and/or aspect, unless stated otherwise.

What is claimed is:

1. A method of reducing HTTP header size, comprising determining at least one or more header content items to suppress in the HTTP header;
including the one or more header content items to suppress in a suppression identifier list;
transmitting the suppression identifier list between at least two devices exchanging data comprising the HTTP header, wherein the suppression identifier list associates header identifier values with at least a portion of the one or more header content items to suppress in the HTTP header, wherein
determining the at least one of the one or more header content items to suppress comprises determining a header content item which is present in the HTTP header more than a threshold number of times, and the header content item comprises a static header item;
replacing the one or more header content items with the corresponding header field identifier from the suppression identifier list; and
transmitting the data packet with the one or more header field identifiers replacing the corresponding one or more header content items.

2. The method of claim 1, wherein the suppression list further comprises the HTTP header with one or more markings included in the HTTP header indicating items to be suppressed.

3. The method of claim 1, wherein the suppression identifier list includes a list with ordered header field identifiers corresponding to the suppression list.

4. The method of claim 1, further comprising:
determining that a header content item in the suppression list has changed; and
generating a new suppression list upon the determination that the header content item has changed.

5. The method of claim 1, wherein the header content item comprises at least one of:
an HTTP cookie reference;
a URL reference; or
a line of HTTP header information.

6. A device configured to reduce HTTP header size, comprising:
at least one processor and at least one memory storing instructions that, when executed by the processor, instruct the processor to execute:
a first module adapted to,
determine at least one of the one or more header content items to suppress; include the one or more header content items to suppress in a suppression identifier list;
transmit the suppression identifier list between at least two devices exchanging data comprising an HTTP header, wherein the suppression identifier list associates header identifier values with at least a portion of the one or more header content items to suppress in the HTTP header, wherein, determine the at least one of the one or more header content items suppress comprises determining a header content item which is present in the HTTP header more than a threshold number of times, and the header content item comprises a static header item; the at least one processor having a second module adapted to replace the one or more header content items with the corresponding header field identifier from the suppression identifier list; and
the at least one processor having a third module adapted to transmit the data packet with the one or more header field identifiers replacing the corresponding one or more header content items.

7. A computer program product, comprising:
a non-transitory computer-readable storage medium comprising:
a first set of codes for causing a computer to,
determine at least one of the one or more header content items to suppress in an HTTP header;
include the one or more header content items to suppress in a suppression identifier list;
transmit the suppression identifier list between at least two devices exchanging data comprising the HTTP header, wherein the suppression identifier list associates header identifier values with at least a portion of one or more header content items to suppress in the HTTP header, wherein,
determining the at least one of the one or more header content items to suppress comprises determining a header content item which is present in the HTTP header more than a threshold number of times, and the header content item comprises a static header item;
a second set of codes for causing the computer to replace the one or more header content items with the corresponding header field identifier from the suppression identifier list; and
a third set of codes for causing the computer to transmit the data packet with the one or more header field identifiers replacing the corresponding one or more header content items.

8. An apparatus, comprising:
a processor; and at least one memory storing instructions that, when executed by the processor, instruct the processor to execute:
determining at least one or more header content items to suppress in HTTP header;
including the one or more header content items to suppress in a suppression identifier list;
transmitting the suppression identifier list between at least two devices exchanging data comprising an HTTP header, wherein the suppression identifier list associates header identifier values with at least a portion of one or more header content items to suppress in the HTTP header, wherein,
determining the at least one of the one or more header content items to suppress comprises determining a header content item which is present in the HTTP header more than a threshold number of times, and the header content item comprises a static header item;
replacing the one or more header content items with the corresponding header field identifier from the suppression identifier list; and
transmitting the data packet with the one or more header field identifiers replacing the corresponding one or more header content items.

9. An apparatus for reducing HTTP header size, comprising at least one of a processor and a memory device, wherein the at least one of the processor and the memory device comprise:
   a communication module operable to: determine at least one or more header content items to suppress in the HTTP header; include the one or more header content items to suppress in a suppression identifier list;
   transmit the suppression identifier list between at least two devices exchanging data comprising the HTTP header, wherein the suppression identifier list associates header identifier values with at least a portion of the one or more header content items to suppress in the HTTP header, wherein, determining the at least one of the one or more header content items to suppress comprises determining a header content item which is present in the HTTP header more than a threshold number of times, and the header content item comprises a static header item; a content module operable to replace the one or more header content items with the corresponding header field identifier from the suppression identifier list; and wherein, the communication module is further operable to transmit the data packet with the one or more header field identifiers replacing the corresponding one or more header content items.

10. The apparatus of claim 9, wherein the communication module is further operable to transmit the suppression list, wherein the suppression list includes reference to one or more header content items associated with the HTTP header of a data packet.

11. The apparatus of claim 10, wherein the suppression list comprises at least the HTTP header with one or more markings included in the HTTP header indicating items to be suppressed.

12. The apparatus of claim 9, wherein the suppression identifier list includes a list with ordered header field identifiers corresponding to the suppression list.

13. The apparatus of claim 9, wherein the content module operable is further operable to:
   determine that a header content item in the suppression list has changed; and
   generate a new suppression list upon the determination that the header content item has changed.

14. The apparatus of claim 9, wherein the header content item comprises at least one of:
   an HTTP cookie reference;
   a URL reference; or
   a line of HTTP header information.

* * * * *